(12) United States Patent
Ho et al.

(10) Patent No.: US 7,619,169 B1
(45) Date of Patent: Nov. 17, 2009

(54) METHOD AND APPARATUS FOR REDUCING ELECTROMAGNETIC RADIATED EMISSIONS FROM A CHASSIS

(75) Inventors: Phong Hoang Ho, Cary, NC (US); Sean P. Ryan, Wake Forest, NC (US); Stephen Aubrey Scearc, Cary, NC (US)

(73) Assignee: Cisco Technologies, Inc., San Jose, CA (US)

( * ) Notice: Subject to any disclaimer, the term of this patent is extended or adjusted under 35 U.S.C. 154(b) by 963 days.

(21) Appl. No.: 10/637,333

(22) Filed: Aug. 8, 2003

(51) Int. Cl.
*H05K 9/00* (2006.01)

(52) U.S. Cl. .................. 174/354; 174/368; 174/372

(58) Field of Classification Search ............ 174/354, 174/368, 371, 372; 361/816, 818, 800
See application file for complete search history.

(56) References Cited

U.S. PATENT DOCUMENTS

| | | | |
|---|---|---|---|
| 3,478,303 A | 11/1969 | Dauser | |
| 3,528,050 A | 9/1970 | Hindenburg | |
| 4,087,149 A | 5/1978 | Fischer | |
| 4,186,981 A | 2/1980 | Holton | |
| 4,944,692 A | 7/1990 | Allina | |
| 5,022,873 A | 6/1991 | Kollman | |
| 5,083,936 A | 1/1992 | Yang | |
| 5,118,307 A | 6/1992 | Knoop et al. | |
| 5,233,507 A | 8/1993 | Gunther | |
| 5,235,492 A * | 8/1993 | Humbert et al. ............ | 361/818 |
| 5,451,167 A | 9/1995 | Zielinski | |
| 5,453,028 A | 9/1995 | Grambley et al. | |
| 5,539,149 A * | 7/1996 | Gatti ......................... | 174/355 |
| 5,746,326 A | 5/1998 | Hong | |
| 6,283,770 B1 * | 9/2001 | Leung et al. ................. | 439/92 |
| 6,933,437 B1 * | 8/2005 | Chang ........................ | 174/368 |
| 2002/0129951 A1* | 9/2002 | Babb et al. ................. | 174/35 R |
| 2005/0039935 A1* | 2/2005 | Kolb et al. ................. | 174/35 R |

* cited by examiner

*Primary Examiner*—Hung V Ngo
(74) *Attorney, Agent, or Firm*—Brinks Hofer Gilson & Lione (57) ABSTRACT

The disclosed device is directed towards an electromagnetic compatibility clip comprising a body having a first side and a second side opposite the first side. The first side is configured to contact a top surface of a chassis separator and a bottom surface of the chassis separator. The second side of the body is configured to contact an upper module mounted on the upper surface of the chassis separator. The second side of the body is configured to contact a lower module mounted on the lower surface of the chassis separator. The body is configured to maintain electrical contact between the chassis separator, the upper module and the lower module. A locking portion is defined in the body. The locking portion is configured to interlock with the chassis separator. A compression force control element is defined in the body. At least one spring contact is defined in the body.

28 Claims, 5 Drawing Sheets

METHOD AND APPARATUS FOR REDUCING ELECTROMAGNETIC RADIATED EMISSIONS FROM A CHASSIS

BACKGROUND

The present disclosure relates to the field of reduction of electromagnetic radiated emissions from chassis. In particular, the disclosure relates to a dual action clip that maintains electrical contact between a center metallic separator and both an upper module and a lower module.

Advancements in processing systems have led to improved efficiency and speed. The advancements in processing systems have also led to more compact hardware designs. The more compact hardware designs include processing system subcomponents sharing a common chassis with very little separation. In some chassis designs, modules are vertically separated merely by the thickness of sheet metal. Chassis separators define and support the spaces or bays housing the modules in the chassis above and below the chassis separator. The vertical chassis designs create interfaces that may be prone to energy emissions. The sheet metal chassis separators are susceptible to radiated energy emissions. The electromagnetic radiated emissions are unwanted. The advancements in the processing systems with more closely packed modules having higher clock frequencies exacerbate the problem of electromagnetic radiated emissions.

Reduction of the electromagnetic radiated emissions can be accomplished through conductive contact from the chassis separator to both the upper module and the lower module of the chassis. An electromagnetic compatibility clip can be employed on the chassis separator between the upper and lower modules of the chassis. The electromagnetic compatibility clip maintains electrical contact between the upper module and the lower module. The prior art devices for reducing the electromagnetic radiated emissions fail to match the advanced chassis designs. The prior art devices are adapted for a single metal-to-metal interface of outdated chassis designs. The prior art merely has an electromagnetic compatibility clip fashioned to interface with the outdated chassis designs. Also, the advanced chassis designs have more stringent rack unit form factors, thus having reduced module heights. The prior art clips exceed the form factors of the advanced chassis designs, thus are incompatible with the more stringent rack unit form factors.

What is needed in the art is a single electromagnetic compatibility clip that is compatible with advanced chassis designs and maintains contact to both the upper module and lower module simultaneously.

SUMMARY

The disclosed device is directed towards an electromagnetic compatibility clip comprising a body having a first side and a second side opposite the fist side. The first side is configured to contact a top surface of a chassis separator and a bottom surface of the chassis separator. The second side of the body is configured to contact an upper module mounted on the upper surface of the chassis separator. The second side of the body is configured to contact a lower module mounted on the lower surface of the chassis separator. The body is configured to maintain electrical contact between the chassis separator, the upper module and the lower module. A locking portion is defined in the body. The locking portion is configured to interlock with the chassis separator. A compression force control element is defined in the body. At least one spring contact is defined in the body.

In an alternative embodiment, the disclosed device is directed towards an electromagnetic compatibility clip comprising a structural support means formed in a substantially semi-circular cross section configured to demountably couple to an upper surface and a lower surface of a chassis separator. A locking means is defined in the structural support. The locking means is configured to interlock with the chassis separator. A compression force control means is defined in the structural support. At least one biasing contact means is defined in the structural support.

A method of reducing electromagnetic radiated emissions from a chassis is disclosed. The method comprises disposing an electromagnetic compatibility clip on a chassis separator coupled to the chassis. The electromagnetic compatibility clip comprises a body having a first side and a second side opposite the first side. The first side is configured to contact a top surface of the chassis separator and a bottom surface of the chassis separator. The second side of the body is configured to contact an upper module mounted on the upper surface of the chassis separator. The second side of the body is configured to contact a lower module mounted on the lower surface of the chassis separator, wherein the body is configured to maintain electrical contact between the chassis separator, the upper module and the lower module. The method includes contacting the first side of the body with the chassis separator. The method includes contacting the second side of the body with the upper module and the lower module. The method includes maintaining electrical connectivity between the upper module, the chassis separator and the lower module.

DETAILED DESCRIPTION

Persons of ordinary skill in the art will realize that the following disclosure is illustrative only and not in any way limiting. Other embodiments of the invention will readily suggest themselves to such skilled persons having the benefit of this disclosure.

The disclosure describes an electromagnetic compatibility clip configured for use on a chassis separator. The chassis separator is a component located in a chassis of a processing system. The chassis separator divides the chassis into individual compartments or bays for mounting processor modules. The chassis typically supports modules in the module bays in a vertical arrangement or stack. The chassis separator supports and divides the module bays. The chassis separator is a thin sheet like structure. The modules mount on two sides of the chassis separator with minimal material separation. The electromagnetic compatibility clip mounts to the chassis separator along the exposed or outer edges of the chassis separator and between the modules. The electromagnetic compatibility clip maintains electrical connectivity between the two modules and the chassis separator within the chassis.

Figure 1:
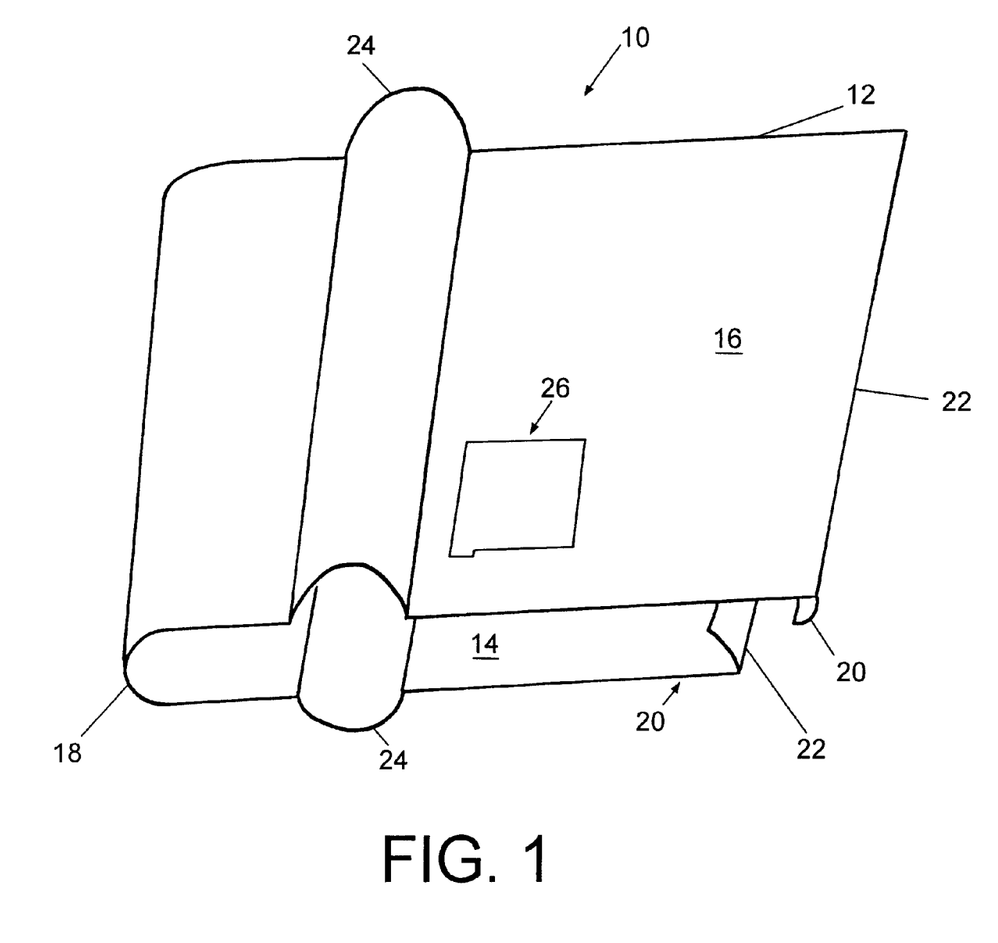
FIG. 1 is a perspective view of an exemplary electromagnetic compatibility clip.

Referring to FIG. 1 a perspective view of an exemplary electromagnetic compatibility clip is illustrated. The electromagnetic compatibility clip 10 comprises a means for structural support or simply a body 12 having a first side 14 and a second side 16 opposite the first side 14. The body 12 can comprise an electrically conductive material. In an exemplary embodiment, the body 12 can comprise an alloy of Beryllium Copper, specifically a BeCu ¼ hard alloy 25 that is heat treated. In an alternate exemplary embodiment, the body 12 can comprise parts or portions of electrically conductive materials, such that electrical conductivity is maintained between the first surface 14 and the second surface 16. The body 12 or structural support means can be formed in into a shape having a portion with a semi-circular cross-section in order to conform to the exterior of the chassis separator to minimize the space taken by the electromagnetic compatibility clip 10. The body 12 can be formed as a planar sheet folded about an edge 18 having an arch shape cross-section. The body 12 is formed such that the first side is configured to contact a top surface of the chassis separator as well as a bottom surface of the chassis separator. The bottom surface of the chassis separator being on an opposite side from the top surface of the chassis separator as is inherent in a sheet material structure like a chassis separator. The first surface 14 can also contact the edge of the chassis separator formed by the intersection of the top and bottom surfaces. The edge is exterior on the chassis separator. The body 12 can be a solid sheet, a mesh, a combination of mesh, fibers and sheet material, and the like.

The body 12 includes a means for locking the electromagnetic compatibility clip 10 to the chassis separator or simply a locking portion 20 defined in the body 12. The locking portion 20 is configured to interlock with the chassis separator (not shown) in order to securely mount the electromagnetic compatibility clip 10 to the chassis separator. The locking portion 20 can include a hook shape that inserts into features of the chassis separator. The locking portion 20 can be formed along leading edges 22 of the body 12. In another exemplary embodiment, the locking portion 20 can be formed in the body extending out of the first side 14. The locking portion 20 can also be formed as a tab section of the body 12 including both the first side 14 and the second side 16 as part of the locking portion 20. A plurality of locking portions 20 can also be formed in the body 12. It is contemplated that various locking means can be defined in the body 12 in order to secure the electromagnetic compatibility clip 10 to the chassis separator.

Figure 5:
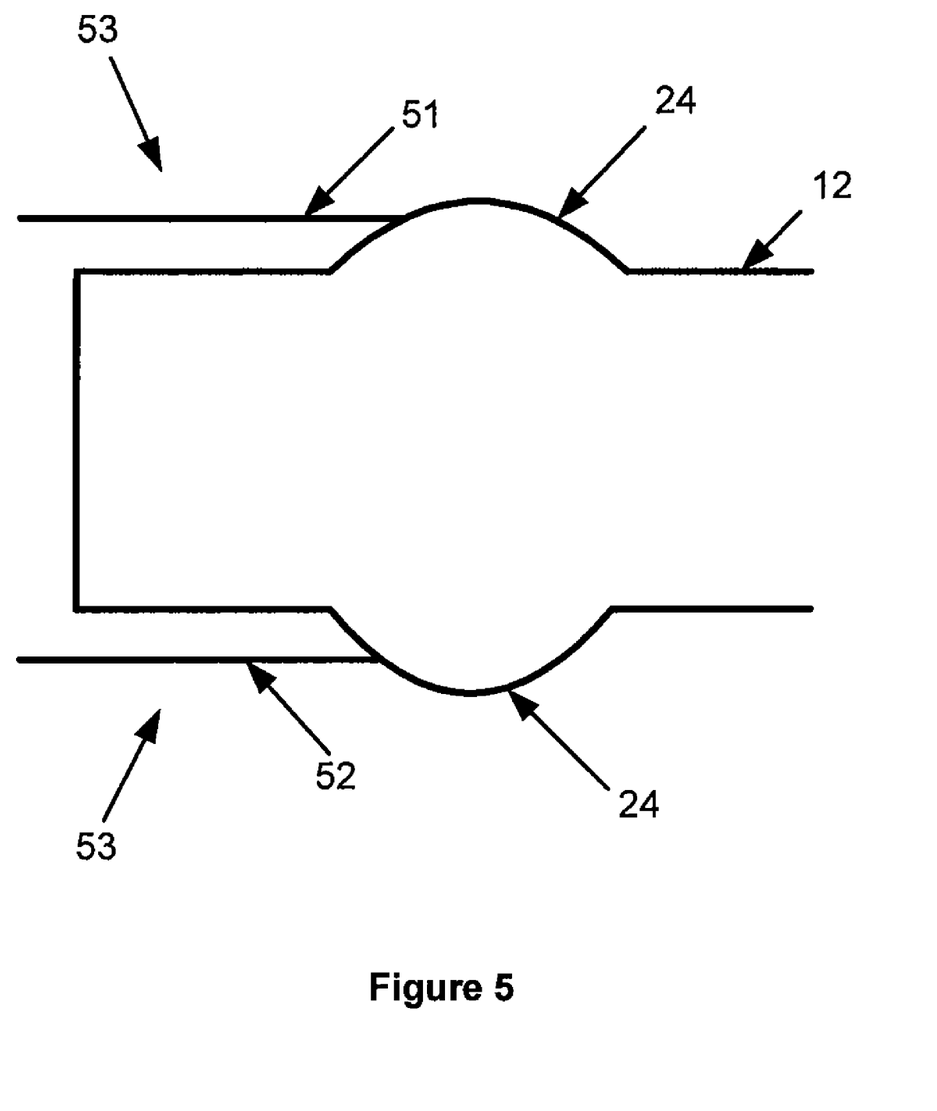
FIG. 5 illustrates an upper module, lower module, and module bay.

A means for contacting and biasing the modules or simply a spring contact 24 is defined in the body 12. The spring contact 24 maintains a physical contact with modules adjacent the chassis separator mounted in the module bays. A plurality of spring contacts 24 can be employed in alternative exemplary embodiments. In the exemplary embodiment of FIG. 1, two spring contacts 24 are illustrated. The spring contact 24 is formed from the body 12 as a discontinuity along the body 12. The discontinuity raises the second side 16 while forming a depression in the first side 14. In exemplary embodiments, the spring contact 24 can be formed as an arch or arcuate shape in the body 12. As shown in FIG. 5, the spring contacts 24 contact the modules in the upper and lower module bays simultaneously and provide a continuous electrical path for the upper module 51 and the lower module 52. In FIG. 5, the upper module 51 and lower module 52 are in module bays 53. In the exemplary embodiment shown in FIG. 1, the spring contact 24 is formed in the body 12 between the edge 18 and the leading edge 22. It is contemplated that the spring contact 24 can be formed along the leading edge 22 and any location along the body 12. The spring contact 24 can extend continuously along the body width or length as well as be staggered or bisected by other features of the body 12.

A means for controlling the compression forces exerted on the body 12 or simply a compression force control element 26 is formed in the body 12. The compression force control element 26 can be a groove, notch aperture or slot defined in the body 12 extending through the first side 14 and the second side 16. The compression force control element 26 can reduce the stresses through the body 12. The compression force control element 26 can regulate the spring contact 24 interface with the modules mounted with the electromagnetic compatibility clip 10.

Figure 2:
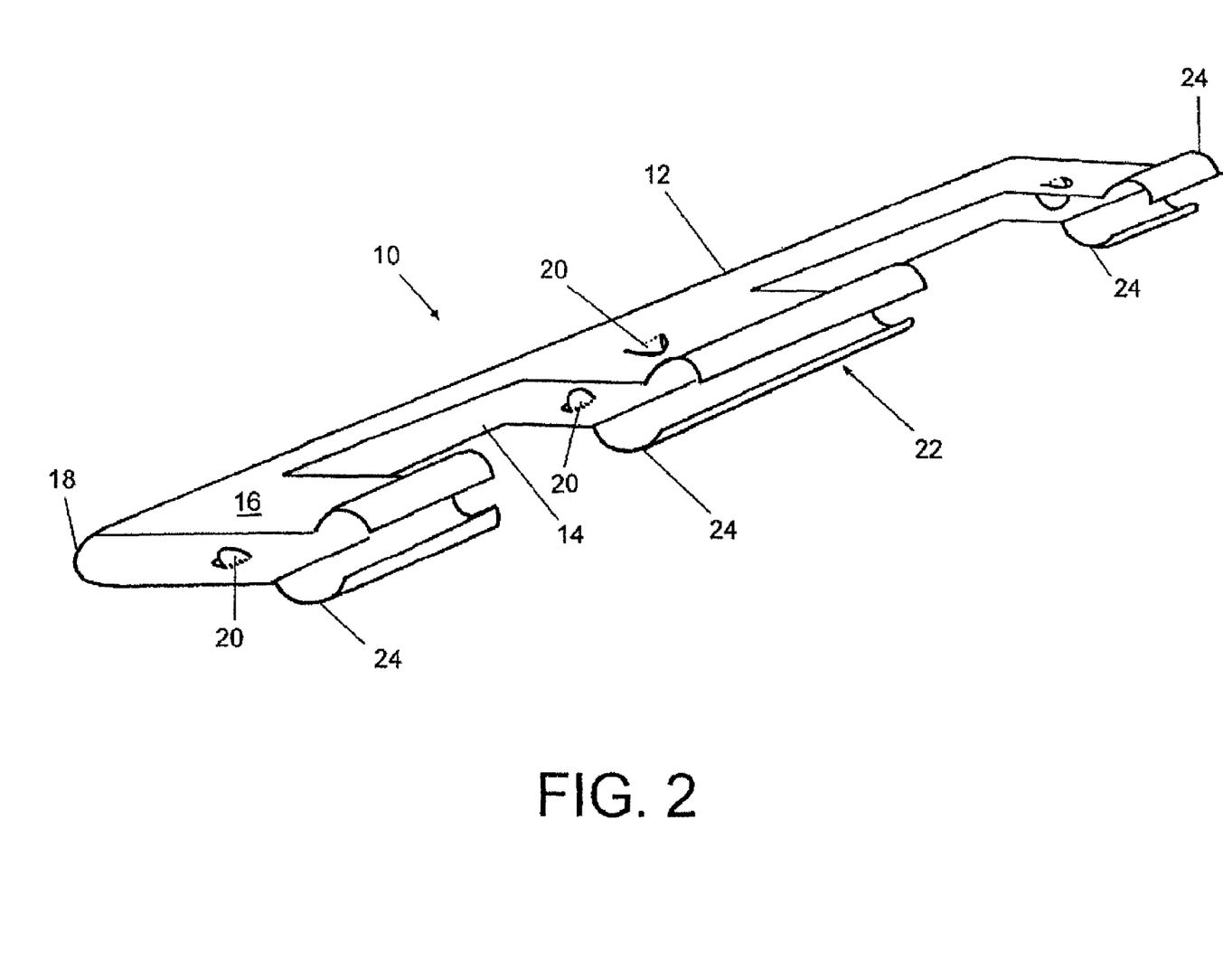
FIG. 2 is a perspective view of an exemplary continuous electromagnetic compatibility clip.

FIG. 2 is a perspective view of an exemplary continuous electromagnetic compatibility clip. The electromagnetic compatibility clip 10 has a continuous repeating pattern of spring contactors 24 and locking portions 20. The spring contactor 24 in the exemplary embodiment illustrated in FIG. 2 is proximate the leading edge 22. The locking portions 20 are formed in the body 12 between the arch edge 18 and the leading edge 22. It is contemplated that the continuous electromagnetic compatibility clip can be utilized for longer or extended chassis separators or merely to provide a convenient single clip for employment on a chassis separator instead of multiple electromagnetic compatibility clips.

Figure 3:
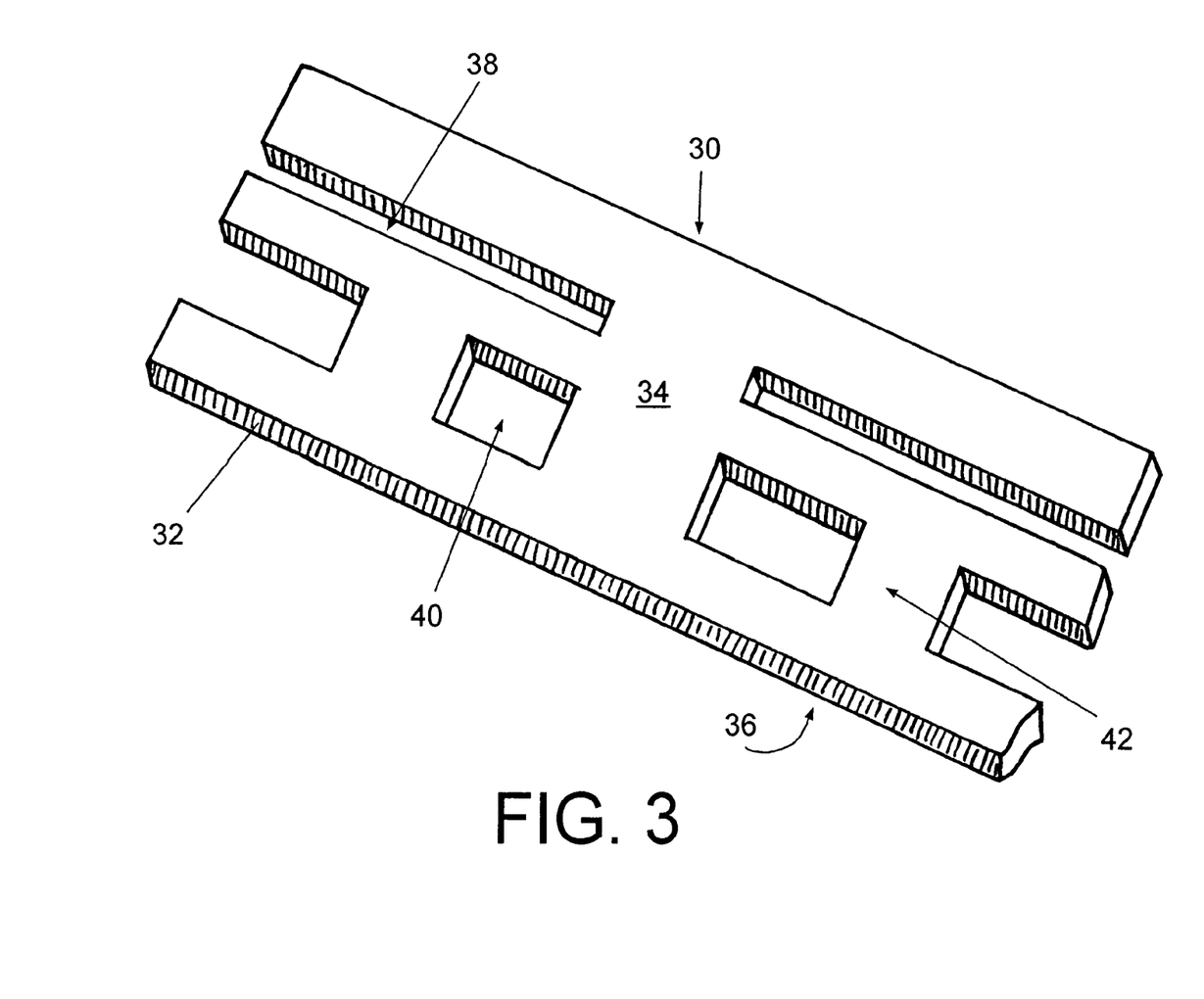
FIG. 3 is a partial perspective view of an exemplary chassis separator.
Figure 4:
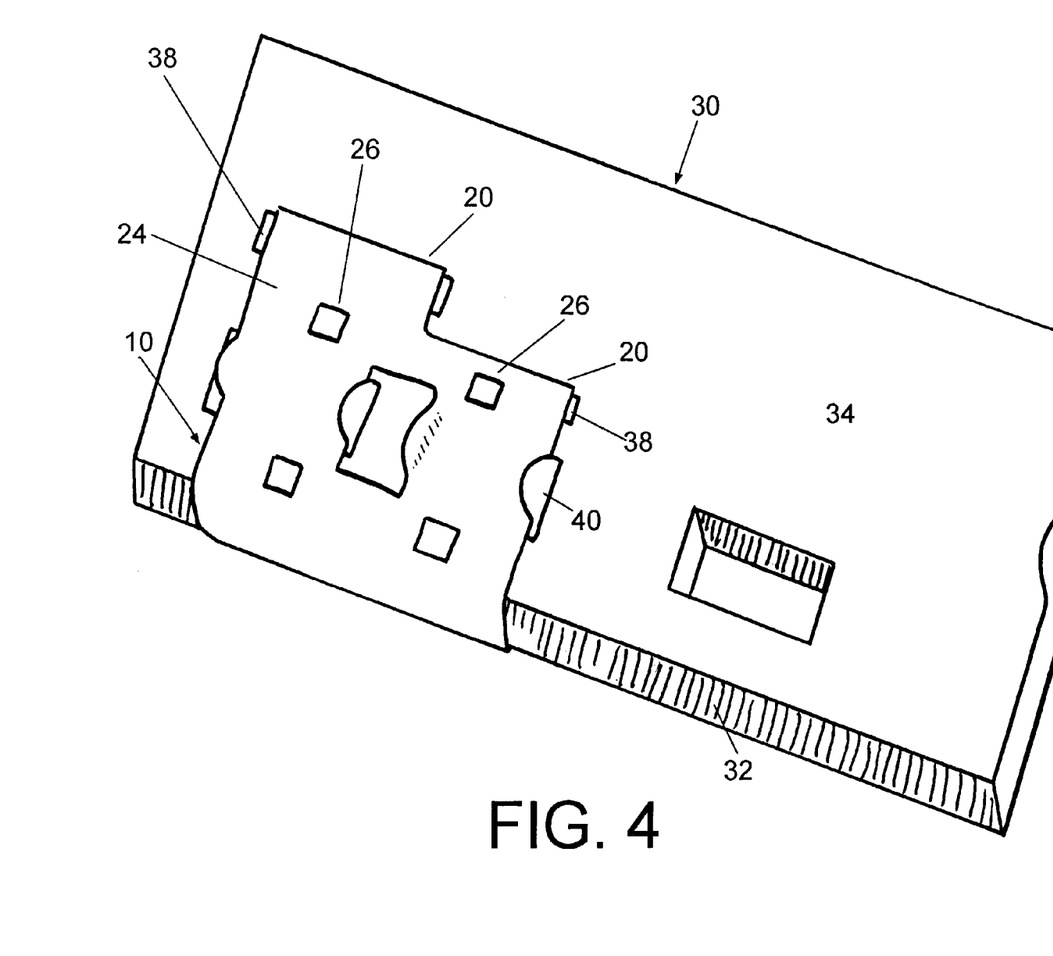
FIG. 4 is a partial perspective view of another exemplary electromagnetic compatibility clip attached to an exemplary chassis separator.

FIG. 3 is a partial perspective view of an exemplary chassis separator. FIG. 4 is a partial perspective view of another exemplary electromagnetic compatibility clip attached to an exemplary chassis separator. The chassis separator 30 is used to divide a chassis (not shown) into sections partitions for mounting modules (not shown). The partitions are known as module bays. The chassis has a limited size and thus restricts the size of the module bays. The chassis separator must also be limited in size and so will have the thickness dimension minimized to the extent possible. Each module bay is sized with a form factor that accommodates the modules to be mounted therein. By minimizing the thickness of the chassis separator the form factor can be minimized. The chassis separator 30 at FIG. 3 includes an exterior edge 32 formed at the intersection of the top surface 34 and bottom surface 36 of the chassis separator 30. Features for locking the electromagnetic compatibility clip 10 to the chassis separator 30 or simply receivers 38 are formed on the chassis separator 30. The receivers 38 are configured to allow for the insertion and coupling of the electromagnetic compatibility clip 10. The locking portion 20 of the electromagnetic compatibility clip 10 facilitates the engagement and locking function of the electromagnetic compatibility clip 10 with the chassis separator 30. A portion of the chassis separator 30 is employed to provide compression relief for the electromagnetic compatibility clip 10. A relief section 40 is formed in the chassis separator 30 to allow for compression relief to the spring contact 24. The relief section in the chassis separator 30 is configured to allow the electromagnetic compatibility clip 10 to deflect below the top surface 34 and bottom surface 36 without permanent deflection of the electromagnetic compatibility clip 10. The feature allowing the deflection of the electromagnetic compatibility clip 10 provides for versatility of modules. In the case where the vertical height of the module bay cannot be altered, the flexibility provided with the relief section 40 allows for more variation in module sizes. The relief section 40 effectively minimizes the thickness of the chassis. Thus, the electromagnetic compatibility clip 10 can be employed in chassis with smaller spaces. A bridge feature 42 is also formed in the chassis separator 30 to facilitate the ease of attachment of the electromagnetic compatibility clip 10.

In use, the electromagnetic compatibility clip 10 is disposed over the chassis separator 30 proximate the exterior edge 32 of the chassis separator 30. The electromagnetic compatibility clip 10 is disposed such that the first side 14 of the electromagnetic compatibility clip 10 is contacted with the top surface 34 and the bottom surface 36 of the chassis separator 30. The locking portion 20 of the electromagnetic compatibility clip 10 is received by the receiver 38. The leading edge 22 of the electromagnetic compatibility clip 10 rides over the bridge feature 42 of the chassis separator 30. The spring contact 24 aligns with the relief section of the chassis separator 30. In this alignment, when the upper module is mounted in the module bay, the spring contact 24 can flex into the relief section 40 and displace compression forces. The compression forces acting on the electromagnetic compatibility clip 10 can also be controlled by the compression force control element 26. The spring contact 24 formed on the body 12—of the electromagnetic compatibility clip 10 proximate the top surface 34 and the upper module mounted on the top surface 34 maintains electrical connectivity with the upper module. The spring contact 24 formed on the body 12 of the electromagnetic compatibility clip 10 proximate the bottom surface 36 and the lower module mounted on the bottom surface 36 maintains electrical connectivity with the lower module. The electromagnetic compatibility clip 10 can thus, maintain simultaneous electrical contact with both the upper module, chassis separator and lower module. The simultaneous electrical contact is repeatable due to the unique configuration. With the upper module, chassis separator and lower module electrically connected, the radiated emissions of the chassis are reduced. Additionally, the configuration of the electromagnetic compatibility clip 10 coupled with the chassis separator minimizes the form factor in the chassis to a predetermined value. The module heights of the upper and lower modules, mounted in the module bays adjacent the chassis separator, are also minimized to predetermined values. The result of the reduction of the size of the electromagnetic compatibility clip is to minimize the module bay openings.

While embodiments and applications of this disclosure have been shown and described, it would be apparent to those skilled in the art that many more modifications than mentioned above are possible without departing from the inventive concepts herein. The disclosure, therefore, is not to be restricted except in the spirit of the appended claims.

What is claimed is:

1. An electromagnetic compatibility clip comprising:
   a first side and a second side opposite said first side, said first side configured to contact a top surface of a chassis separator and a bottom surface of said chassis separator;
   a locking portion configured to interlock with said chassis separator; and
   a compression force control element,
   wherein said second side comprises:
      an upper spring contact configured to maintain electrical connection between an upper module and said chassis separator, the upper spring contact being configured as a discontinuity that extends toward the upper module, and
      a lower spring contact configured to maintain electrical connection between a lower module and said chassis separator, the lower spring contact being configured as a discontinuity that extends toward the lower module, and
   wherein said first side and said second side are configured to maintain electrical contact between said chassis separator, said upper module, and said lower module, and
   wherein said upper spring contact or lower spring contact is configured to deflect into a relief section of the chassis separator.

2. The electromagnetic compatibility clip of claim 1 wherein the upper spring contact or the lower spring contact is configured to bias at least one of said upper module and said lower module.

3. The electromagnetic compatibility clip of claim 1 wherein said electromagnetic compatibility clip is configured to reduce radiated energy from a chassis coupled to said chassis separator.

4. The electromagnetic compatibility clip of claim 1 wherein the first side and second side are operable to maintain a predetermined minimal rack unit form factor.

5. The electromagnetic compatibility clip of claim 1 wherein the first side and second side are operable to receive a predetermined minimal module height in a chassis module bay adjacent said chassis separator.

6. The electromagnetic compatibility clip of claim 1 wherein said locking portion is configured to interlock with a locking feature of said chassis separator.

7. The electromagnetic compatibility clip of claim 1 wherein said upper spring contact and lower spring contact are configured to maintain repeatable electrical contact for said upper module and said lower module.

8. The electromagnetic compatibility clip of claim 1 wherein said upper spring contact and lower spring contact are configured to maintain simultaneous electrical contact between said upper module, said chassis separator and said lower module.

9. The electromagnetic compatibility clip of claim 1 wherein said locking portion comprises a substantially hook shaped feature insertable into a recess formed in said chassis separator.

10. The electromagnetic compatibility clip of claim 1 wherein said upper spring contact or lower spring contact comprises a discontinuity along said second side.

11. The electromagnetic compatibility clip of claim 1 wherein said upper spring contact or lower spring contact comprises a raised portion along said second side and corresponding depression along said first side.

12. The electromagnetic compatibility clip of claim 11 wherein said raised portion and corresponding depression are a substantially arcuate region.

13. The electromagnetic compatibility clip of claim 1 wherein said compression force control element comprises a slot formed in said first side and second side.

14. The electromagnetic compatibility clip of claim 1 wherein said compression force control element is proximate said upper spring contact and lower spring contact.

15. The electromagnetic compatibility clip of claim 1 further comprising an arch feature formed in said first side or second side, said arch feature being disposable over an edge of said chassis separator.

16. The electromagnetic compatibility clip of claim 1 further comprising a substantially arcuate fold portion, said substantially arcuate fold portion including said first side being folded into inner facing surfaces demountably couplable with said chassis separator and said second side being folded into outer facing surfaces couplable with said upper module and said lower module.

17. The electromagnetic compatibility clip of claim 1, wherein the upper spring contact is an arch that extends away from the chassis separator and the lower spring contact is an arch that extends away from the chassis separator.

18. A method of reducing electromagnetic radiated emissions from a chassis comprising:
- disposing an electromagnetic compatibility clip on a chassis separator coupled to the chassis, said electromagnetic compatibility clip comprising a body having a first side and a second side opposite said first side, said first side configured to contact a top surface of said chassis separator, and a bottom surface of said chassis separator, said second side of said body configured to contact an upper module mounted on said upper surface of said chassis separator, said second side of said body configured to contact a lower module mounted on said lower surface of said chassis separator, wherein said body is configured to maintain electrical contact between said chassis separator, said upper module and said lower module;
- contacting said first side of said body with said chassis separator;
- contacting said second side of said body with said upper module and said lower module;
- maintaining electrical connectivity between said upper module, said chassis separator and said lower module;
- contacting said upper module with a first spring contact defined in said body;
- contacting said lower module with a second spring contact defined in said body;
- wherein said upper spring contact or lower spring contact is configured to be deflected into a relief section of the chassis separator.

19. The method of claim 18 further comprising:
- interlocking said electromagnetic compatibility clip to said chassis separator with a locking portion defined in said body.

20. The method of claim 18 further comprising:
- controlling compression force on said body between said chassis separator and said upper module and said lower module with a compression force control element defined in said body.

21. The method of claim 18 further comprising:
- biasing said upper module and said lower module with at least one spring contact defined in said body.

22. The method of claim 18 further comprising:
- maintaining a form factor in said chassis with said electromagnetic compatibility clip.

23. The method of claim 18 further comprising:
- maintaining a module minimum height in a chassis module bay adjacent said chassis separator with said electromagnetic compatibility clip.

24. A system comprising:
- a chassis separator; and
- an electromagnetic compatibility clip comprising:
  - an upper spring contact and a lower spring contact, the upper spring contact configured to maintain electrical connection between an upper module and the chassis separator, and the lower spring contact configured to maintain electrical connection between said lower module and said chassis separator, and
  - a locking portion that is configured to interlock with the chassis separator,
- wherein the chassis separator comprises a first recess for interlocking with the locking portion, and a second recess operable to allow the upper spring contact or lower spring contact to deflect below a top surface or a bottom surface of the chassis separator.

25. The system of claim 24, wherein the electromagnetic compatibility clip maintains electrical contact between said chassis separator, an upper module mounted on said chassis separator and a lower module mounted on said chassis separator.

26. The system of claim 24, wherein the electromagnetic compatibility clip comprises a compression force control element that is proximate the upper spring contact and lower spring contact.

27. The system of claim 26, wherein the compression force control element comprises a slit in the electromagnetic compatibility clip.

28. The system of claim 24, wherein the electromagnetic compatibility clip reduces electromagnetic radiated emissions from a chassis connected to the chassis separator.

* * * * *

UNITED STATES PATENT AND TRADEMARK OFFICE
CERTIFICATE OF CORRECTION

PATENT NO. : 7,619,169 B1
APPLICATION NO. : 10/637333
DATED : November 17, 2009
INVENTOR(S) : Phong Hoang Ho et al.

It is certified that error appears in the above-identified patent and that said Letters Patent is hereby corrected as shown below:

On the Title Page

Item (75), replace "Stephen Aubrey Scearc" with --Stephen Aubrey Scearce--.

On the Title Page:

The first or sole Notice should read --

Subject to any disclaimer, the term of this patent is extended or adjusted under 35 U.S.C. 154(b) by 1292 days.

Signed and Sealed this

Twelfth Day of October, 2010

David J. Kappos
*Director of the United States Patent and Trademark Office*